US012813205B2

(12) United States Patent
Adams et al.

(10) Patent No.: US 12,813,205 B2
(45) Date of Patent: Nov. 24, 2026

(54) ATOMIC OXYGEN DETECTION IN SEMICONDUCTOR PROCESSING CHAMBERS

(71) Applicant: Applied Materials, Inc., Santa Clara, CA (US)

(72) Inventors: Bruce E. Adams, Portland, OR (US); Samuel C. Howells, Portland, OR (US); Martin A. Hilkene, Gilroy, CA (US); Jose Antonio Marin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1085 days.

(21) Appl. No.: 17/026,905

(22) Filed: Sep. 21, 2020

(65) Prior Publication Data

US 2022/0093428 A1 Mar. 24, 2022

(51) Int. Cl.
*H10P 72/00* (2026.01)
*C23C 8/10* (2006.01)
(Continued)

(52) U.S. Cl.
CPC ............ *H10P 72/0604* (2026.01); *C23C 8/10* (2013.01); *C23C 8/36* (2013.01); *H01J 37/244* (2013.01);
(Continued)

(58) Field of Classification Search
CPC ......... H01L 21/67253; H01L 21/67069; C23C 8/10; C23C 8/36; H01J 37/244;
(Continued)

(56) References Cited

U.S. PATENT DOCUMENTS 5,112,456 A 5/1992 Worrell et al.
6,451,159 B1 * 9/2002 Lombardi ........... C23C 16/4401 118/712
(Continued)

FOREIGN PATENT DOCUMENTS

CN 106680325 A 5/2017
CN 109060894 A 12/2018
(Continued)

OTHER PUBLICATIONS

International Search Report and Written Opinion mailed Jan. 4, 2022 in International Patent Application No. PCT/US2021/050574, 9 pages.
(Continued)

*Primary Examiner* — Parviz Hassanzadeh
*Assistant Examiner* — Margaret Klunk
(74) *Attorney, Agent, or Firm* — Kilpatrick Townsend & Stockton LLP

(57) ABSTRACT

Semiconductor processing systems are described to measure levels of atomic oxygen using an atomic oxygen sensor positioned within a substrate processing region of a substrate processing chamber. The processing systems may include a semiconductor chamber that has a chamber body which defines a substrate processing region. The processing chamber may also include a substrate support positioned within the substrate processing region. The atomic oxygen sensor may be positioned proximate to the substrate support in the substrate processing region of the chamber. Also described are semiconductor processing methods that include detecting a concentration of atomic oxygen in the substrate processing region with an atomic oxygen sensor positioned in the semiconductor processing chamber. The atomic oxygen sensor may include at least one electrode comprising a material selectively permeable to atomic oxygen over
(Continued)

molecular oxygen, and may further include a solid electrolyte that selectively conducts atomic oxygen ions.

18 Claims, 6 Drawing Sheets

(51) Int. Cl.
*C23C 8/36* (2006.01)
*H01J 37/244* (2006.01)
*H01J 37/32* (2006.01)

(52) U.S. Cl.
CPC .. *H01J 37/32715* (2013.01); *H01J 37/32834* (2013.01); *H01J 2237/24585* (2013.01); *H01J 2237/332* (2013.01); *H10P 72/0421* (2026.01)

(58) Field of Classification Search
CPC ....... H01J 37/32715; H01J 2237/24585; H01J 2237/332
See application file for complete search history.

(56) References Cited

U.S. PATENT DOCUMENTS

| | | | | |
|---|---|---|---|---|
| 2005/0009361 | A1* | 1/2005 | DeBoer | C23C 16/52 257/E21.271 |
| 2009/0104719 | A1* | 4/2009 | Gupta | H01L 22/20 438/16 |
| 2009/0180113 | A1* | 7/2009 | Monkowski | G01N 21/68 216/60 |
| 2009/0266298 | A1* | 10/2009 | Okashita | H01J 37/32935 118/712 |
| 2013/0320998 | A1* | 12/2013 | Hanawa | G01R 19/0061 324/629 |
| 2014/0166612 | A1* | 6/2014 | Petisce | B32B 37/025 216/13 |
| 2015/0114559 | A1* | 4/2015 | Han | H01J 37/32963 118/504 |
| 2017/0176349 | A1* | 6/2017 | Gopalan | H01L 21/67253 |
| 2017/0365531 | A1* | 12/2017 | Tedeschi | G01N 27/227 |
| 2018/0088031 | A1* | 3/2018 | Yang | G01N 21/27 |
| 2019/0137415 | A1* | 5/2019 | Gopalan | H01J 37/32935 |

FOREIGN PATENT DOCUMENTS

| | | | |
|---|---|---|---|
| CN | 109470758 | A | 3/2019 |
| EP | 2031084 | A2 | 3/2009 |
| JP | 2004354055 | A | 12/2004 |
| JP | 2019027800 | A | 2/2019 |
| KR | 20090017855 | A | 2/2009 |
| KR | 20150049636 | A | 5/2015 |
| TW | 201839846 | A | 11/2018 |
| TW | 201907150 | A | 2/2019 |
| TW | 202034429 | A | 9/2020 |
| WO | 2012099547 | A1 | 7/2012 |

OTHER PUBLICATIONS

Eberhart, M., et al., “Measurement of atomic oxygen in the middle atmosphere using solid electrolyte sensors and catalytic probes”, Atmos. Meas. Tech., 8, 3701-3714, https://doi.org/10.5194/amt-8-3701-2015, 2015.

Eberhart, M., et. al., “Atomic oxygen number densities in the MLT region measured by solid electrolyte sensors on WADIS-2”, Atmos. Meas. Tech., 12, 2445-2461, https://doi.org/10.5194/amt-12-2445-2019, 2019.

Application No. PCT/US2021/050574, International Preliminary Report on Patentability, Mailed on Mar. 30, 2023, 7 pages.

Office Action issued on Jun. 4, 2024, in corresponding Japanese Application No. 2023518330, 8 pages.

Office Action issued on Apr. 29, 2024, in corresponding Taiwan Application No. 110134849, 14 pages.

Office Action issued on May 23, 2023, in corresponding Taiwan Application No. 110134849, 6 pages.

Office Action issued on Sep. 20, 2024, in corresponding Korean Application No. 20237013277, 22 pages.

* cited by examiner

ATOMIC OXYGEN DETECTION IN SEMICONDUCTOR PROCESSING CHAMBERS

TECHNICAL FIELD

The present technology relates to semiconductor systems, processes, and equipment. More specifically, the present technology relates to systems and processes to detect atomic oxygen in semiconductor processing chambers.

BACKGROUND

Integrated circuits are made possible by processes which produce intricately patterned material layers on substrate surfaces. Producing patterned material on a substrate requires controlled methods for forming and removing material. As device sizes continue to reduce, film characteristics and patterning precision lead to larger impacts on device performance. Operations to form, pattern, and remove materials from substrate surfaces may affect operational characteristics of the devices produced. As material thicknesses and device sizes continue to reduce, there is a need for improved equipment and methods to monitor real-time device fabrication conditions and adjust them to maintain the conditions within an increasingly narrow operating range.

Thus, there is a need for improved systems and methods that can be used to produce high quality devices and structures. These and other needs are addressed by the present technology.

SUMMARY

The present technology includes semiconductor processing systems and methods that measure levels of atomic oxygen using an atomic oxygen sensor positioned within a substrate processing region of a substrate processing chamber. In some embodiments of the present technology, the sensor may be used to measure atomic oxygen levels in an oxygen-containing plasma formed in the substrate processing region of the chamber. In additional embodiments, the sensor may be used to measure atomic oxygen levels in plasma effluents entering the substrate processing region from a remote plasma source outside the chamber. The in-situ, real-time atomic oxygen measurements made by these sensors may be incorporated into a variety of semiconductor processing operations including the evaluation of plasma health, predictive failure, and end-point detection, among other processing operations.

Embodiments of the present technology include a semiconductor chamber that has a chamber body which defines a substrate processing region. In some embodiments, the processing chamber may also include a substrate support positioned within the substrate processing region. An atomic oxygen sensor may be positioned proximate to the substrate support in the substrate processing region of the chamber.

In further embodiments, the atomic oxygen sensor may include at least one electrode made of metallic gold. In still further embodiments, the atomic oxygen sensor may have a ceramic electrolyte that include yttria-stabilized zirconia. In yet further embodiments, the atomic oxygen sensor may be surrounded by an ion suppression screen that reduces the flux of ions contacting the sensor. In still further embodiments, the atomic oxygen sensor may include a reversible barrier that reversibly prevents gases in the semiconductor processing chamber from contacting the sensor. In some embodiments, the atomic oxygen sensor may be positioned between as gas inlet in the semiconductor processing chamber that permits gases to flow into the substrate processing region, and the substrate support. In additional embodiments, the atomic oxygen sensor may be positioned between the substrate support and a gas outlet that permits gases to flow out of the substrate processing region. In still further embodiments, the semiconductor processing chamber may be a plasma processing chamber that includes at least one of a plurality of coils to generate an inductively-coupled plasma in the substrate processing region, at least two electrodes to generate a capacitively-coupled plasma in the substrate processing region, or an inlet for remote plasma effluents generated by a remote plasma system positioned outside the semiconductor processing chamber.

Embodiments of the present technology also include a semiconductor processing chamber that includes a chamber body which defines a substrate processing region. The chamber may also include a gas inlet in the chamber body to supply gas to the substrate processing region, and a gas outlet in the chamber body to remove gas effluents from the substrate processing region. In embodiments, an atomic oxygen sensor may be positioned within the substrate processing region between the gas inlet and the gas outlet.

In further embodiments, the atomic oxygen sensor may be positioned closer to the gas inlet than the gas outlet. In other embodiments, the atomic oxygen sensor may be positioned closer to the gas outlet than the gas inlet. In still further embodiments, the atomic oxygen sensor may include at least one metallic gold electrode, and a ceramic electrolyte made from yttria-stabilized zirconia. In some embodiments, the semiconductor processing chamber that includes the atomic oxygen sensor may also include a substrate support positioned within the substrate processing region of the chamber.

Embodiments of the present technology further include semiconductor processing methods for detecting atomic oxygen in a semiconductor processing chamber. In some embodiments, the methods may include flowing an oxygen-containing gas into a substrate processing region of the semiconductor processing chamber. The methods may further include detecting a concentration of atomic oxygen in the substrate processing region with an atomic oxygen sensor positioned in the semiconductor processing chamber. The atomic oxygen sensor may include at least one electrode that includes a material that is selectively permeable to atomic oxygen over molecular oxygen, and that may further include a solid electrolyte that selectively conducts atomic oxygen ions. The methods may still further include adjusting the flow of the oxygen-containing gas into the semiconductor processing chamber based on the concentration of atomic oxygen detected by the atomic oxygen sensor.

In further embodiments, the methods may include detecting the atomic oxygen with an atomic oxygen sensor that includes at least one electrode permeable to atomic oxygen that may be made of metallic gold, and may further include a solid electrolyte made of yttria-stabilized zirconia. In additional embodiments, the methods may include reducing a flux of ions in the substrate processing region from contacting the atomic oxygen sensor. In still further embodiments, the methods may include unblocking the atomic oxygen sensor from gases in the substrate processing region to permit the sensor to detect the concentration of atomic oxygen in the substrate processing region. In yet further embodiments, the methods may include having the atomic oxygen sensor detect the concentration of atomic oxygen in the oxygen-containing gas supplied to the substrate processing region from a gas inlet in the semiconductor processing chamber. In additional embodiments, the methods may include having the atomic oxygen sensor detect the concentration of atomic oxygen in effluent gases before they exit the substrate processing region through a gas outlet in the semiconductor processing chamber. In still additional embodiments, the methods may further include generating a plasma from the oxygen-containing gas that flows into the substrate processing region, and having the atomic oxygen sensor detect the concentration of atomic oxygen in the plasma.

Such technology may provide numerous benefits over conventional systems and techniques. For example, the atomic oxygen sensor may measure in-situ, real-time concentrations of atomic oxygen in a semiconductor processing system during a processing operation. The atomic oxygen sensor is small enough to fit inside a processing chamber, and accurately detects the level of atomic oxygen present without the need for large, complex chemical instrumentation like mass spectrometry. The atomic sensor can also detect ground-state atomic oxygen without having to excite the oxygen and look for emissions from an excited state. In addition, the atomic oxygen sensor has a high selectivity for atomic oxygen over molecular oxygen, and can provide accurate measurements of small fractions of atomic oxygen present in gas that has a larger fraction of molecular oxygen. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1A:
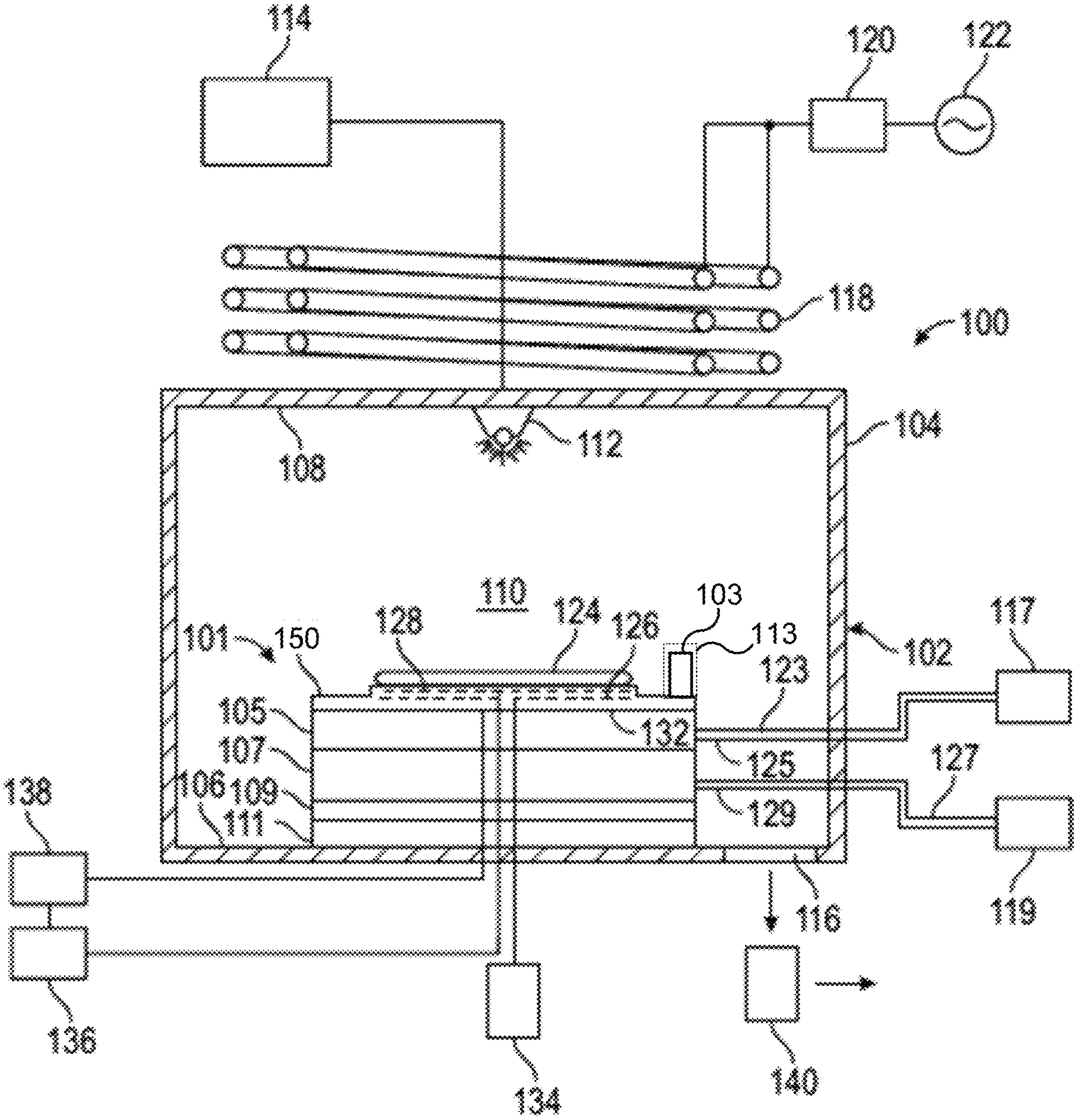
FIGS. 1A-C show schematic cross-sectional views of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes semiconductor processing systems and methods that include atomic oxygen sensors that measure atomic oxygen levels during semiconductor processing operations that use one or more oxygen-containing gases. As semiconductor processing operations have progressed, there is an increased interest in understanding the chemical dynamics of complex systems such as plasmas for depositing materials and treating semiconductor substrates. The plasmas include in-situ plasmas that are generated in a processing region of a semiconductor processing chamber, and remote-generated plasmas that supply plasma effluents into the processing chamber from plasmas generated outside the chamber. Identifying and measuring the species present in these plasmas in real time has proven challenging because of the large number of species present, as well as the fast changes they undergo in the plasma's dynamic environment.

Atomic oxygen is a particularly challenging species to characterize in a plasma environment due to interference from related species like molecular oxygen ($O_2$) and oxygen ions (e.g., $O^-$, $O_2^-$, etc.). Conventional detection techniques include optical absorption spectroscopy and mass spectrometry that attempt to characterize the atomic oxygen with equipment positioned outside the processing chamber. These techniques are generally too slow and inaccurate for precise, real-time characterization of a heterogeneous distribution of atomic oxygen in a semiconductor processing region inside the processing chamber. Thus, the chemical dynamics of oxygen-containing plasmas and plasma effluents in substrate processing regions of substrate processing chambers remain poorly characterized. Without a better understanding of these chemical dynamics, only limited progress can be made in improving operations that utilize these oxygen-containing plasmas.

Embodiments of the present technology address these and other problems with conventional atomic oxygen detection techniques by positioning an atomic oxygen sensor in a semiconductor processing region inside a processing chamber to provide in-situ, real-time measurements of atomic oxygen in the chamber. The atomic oxygen sensor may be small enough to fit inside the substrate processing region of the processing chamber without interfering with semiconductor fabrication operations in the chamber. In some embodiments, the atomic oxygen sensor is small enough to be positioned to characterize a level of atomic oxygen in a location of the semiconductor processing region such as proximate to a gas inlet that permits oxygen-containing gases and effluents to flow into the processing chamber or a gas outlet that permits oxygen-containing gases and effluents to flow out of the chamber. In additional embodiments, the atomic oxygen sensor may be positioned proximate to a substrate support that maintains the position of a substrate in the substrate processing chamber during one or more semiconductor processing operations that include one or more of an oxygen-containing gas or plasma. The ability to position the atomic oxygen sensor at various locations in the substrate processing region inside the processing chamber permits a precise characterization of atomic oxygen in a region where the spatial distribution of atomic oxygen may be heterogeneous.

Embodiments of the present technology also address the problem of characterizing the level of atomic oxygen in an environment that includes related oxygen species that can interfere with atomic oxygen detection. In embodiments of the present technology, an atomic oxygen sensor is provided that may detect atomic oxygen without also detecting molecular oxygen ($O_2$) and ionic oxygen species such as $O_2^-$. In embodiments, the atomic oxygen sensors include sensors that include at least one electrode made with metallic gold that selectively detects atomic oxygen over $O_2$. In further embodiments, the atomic oxygen sensors may be surrounded by an ion suppression screen that reduces the flux of oxygen ions contacting the sensor. In still further embodiments, the atomic oxygen sensors may detect ground-state atomic oxygen without having to excite the oxygen and detect a photon emission when the oxygen returns to a lower-energy state. These embodiments permit accurate detection of atomic oxygen in the presence of other oxygen species that are commonly found in oxygen-containing gases and plasmas present in a substrate processing region during a substrate processing operation.

Although the remaining disclosure will routinely identify specific oxygen-containing deposition and treatment processes utilizing the disclosed technology, it will be readily understood that the systems and methods are equally applicable to a variety of other processes as may occur in the described chambers. Accordingly, the technology should not be considered to be so limited as for use with only the described deposition and treatment processes alone. The disclosure will discuss one possible system and chamber that can be used with the present technology before describing systems and methods or operations of exemplary process sequences according to some embodiments of the present technology. It is to be understood that the technology is not limited to the equipment described, and processes discussed may be performed in any number of processing chambers and systems.

Figure 1B:
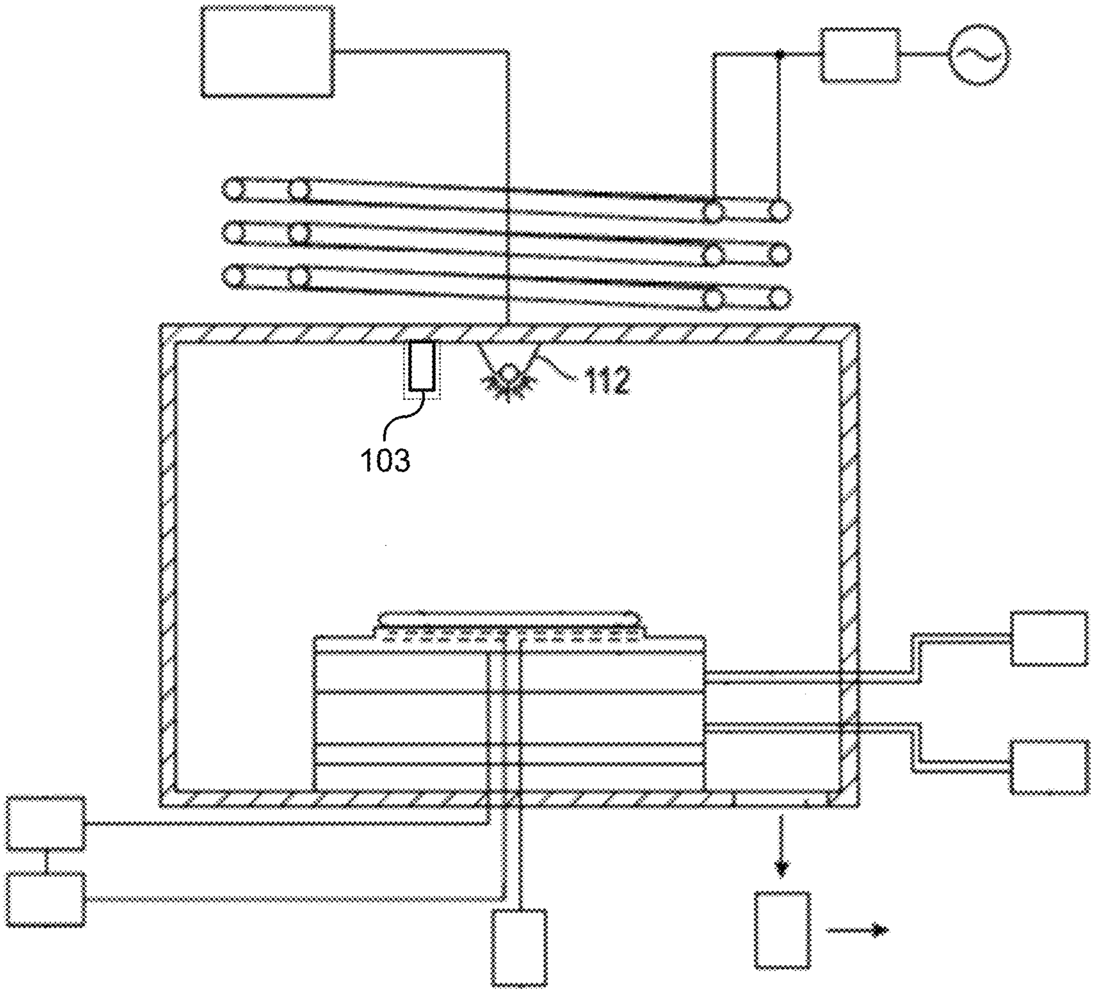
Figure 1C:
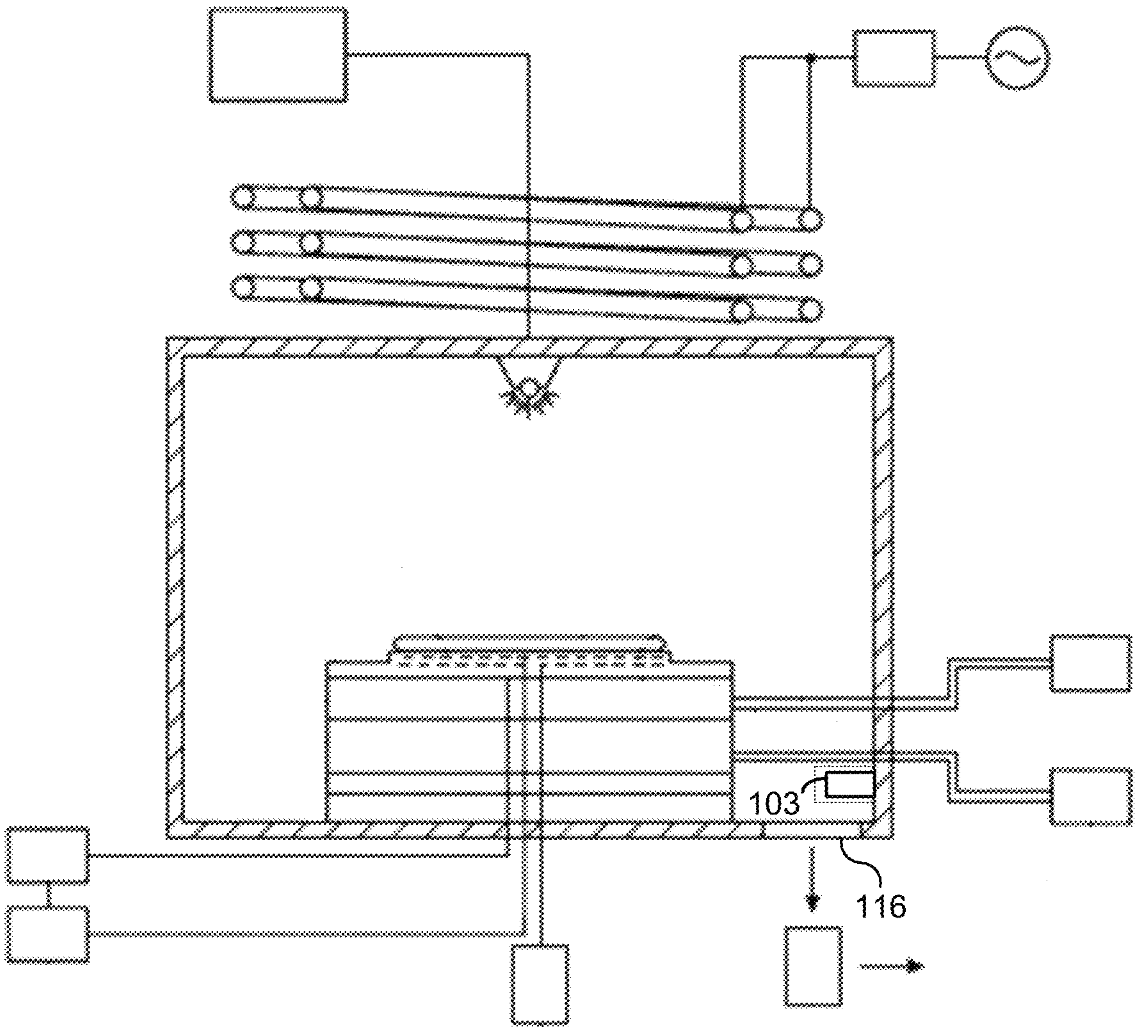

FIGS. 1A-1C illustrate cross-sectional embodiments of an exemplary semiconductor processing chamber 100 with an atomic oxygen sensor 103 positioned at various locations in a substrate processing region of the chamber. FIG. 1A shows a cross-sectional embodiment of the semiconductor processing chamber 100 with the atomic oxygen sensor 103 positioned proximate to a substrate 124 on substrate support assembly 101. The exemplary processing chamber 100 may be, for example, a plasma treatment chamber, an oxidation treatment chamber, a remote-plasma oxidation chamber, an annealing chamber, a physical vapor deposition chamber, a chemical vapor deposition chamber, or an ion implantation chamber, among other type of processing chamber that may receive an oxygen-containing gas.

In some embodiments, an ion suppression barrier 113 may be positioned around the oxygen sensor 103 to reduce or eliminate the migration of ions from the substrate processing region of chamber 100 to the atomic oxygen sensor 103. The ion suppression barrier 113 may include an electrically conductive wire mesh or perforated plate, among other barriers, that maintain a columbic field when an electric potential is applied. The columbic field prevents electrically-charged ions from passing through the ion suppression barrier 113 while permitting neutral species like atomic oxygen to pass. More specifically, ions of like charge as the electrical potential applied to the ion suppression barrier 113 will be pushed away from the ion suppression barrier while ions of opposite charge will be pulled away from the sensor towards the barrier. The flux of both positive and negative ions reaching the sensor will be reduced while neutral species including atomic oxygen can pass freely through the ion suppression barrier. In embodiments, this reduces interference from ionized species in the characterization of atomic oxygen in the substrate processing region.

In some embodiments, the ion suppression barrier 113, or another barrier (not shown) may reversibly shield the atomic oxygen sensor 103 from all gases and plasma effluents in the substrate processing region of the processing chamber 100. The reversible barrier may include an opening, a valve, baffle, door, shutter, aperture, or some other reversibly openable partition to permit the gases and plasma effluents in the substrate processing region to contact the atomic oxygen sensor 103. Controlling the exposure of the atomic oxygen sensor 103 to the atmosphere in the substrate processing region prevents the sensor from contacting gases and plasma effluents that may foul or corrode the sensor's components. For example, the atomic oxygen sensor 103 may be blocked from the atmosphere in the substrate procession region during periods of a deposition or etching operation where gases and plasma effluents are present in the region that can damage the sensor. In embodiments, the reversible barrier may be unblocked when the atomic oxygen sensor 103 is characterizing the atomic oxygen levels in the substrate processing region. In some embodiments, these unblocking periods may occur when the gases and plasma effluents are at reduced pressures or being supplied with reduced power in the substrate processing region.

The processing chamber 100 may include a chamber body 102 having sidewalls 104, a base 106, and a lid 108 that may enclose a processing region 110. An injection apparatus 112 may be coupled with the sidewalls 104 and/or lid 108 of the chamber body 102. A gas panel 114 may be fluidly coupled with the injection apparatus 112 to allow one or more oxygen-containing gases, and other process gases, to be provided into the processing region 110. The injection apparatus 112 may be one or more nozzle or inlet ports, or alternatively a showerhead. Process gases, along with any processing by-products, may be removed from the processing region 110 through an exhaust port 116 formed in the sidewalls 104 or base 106 of the chamber body 102. The exhaust port 116 may be coupled with a pumping system 140, which may include throttle valves, pumps, or other materials utilized to control the vacuum levels within the processing region 110.

In some embodiments, the process gases may be energized to form a plasma within the processing region 110. For example, the process gases may be energized by capacitively or inductively coupling RF power to the process gases. In the embodiment depicted in FIG. 1A, a plurality of coils 118 for inductively coupled plasma generation may be disposed above the lid 108 of the processing chamber 100 and may be coupled through a matching circuit 120 to an RF power source 122.

In the embodiment shown in FIG. 1A, a substrate support assembly 101 may be disposed in the processing region 110 below the injection apparatus 112. The substrate support assembly 101 may include an electrostatic chuck 150 and a base assembly 105. The base assembly may be coupled with the electrostatic chuck 150 and a facility plate 107. The facility plate 107 may be supported by a ground plate 111, and may be configured to facilitate electrical, cooling, heating, and gas connections with the substrate support assembly 101. The ground plate 111 may be supported by the base 106 of the processing chamber, although in some embodiments the assembly may couple with a shaft that may be vertically translatable within the processing region of the chamber. An insulator plate 109 may insulate the facility plate 107 from the ground plate 111, and may provide thermal and/or electrical insulation between the components.

The base assembly 105 may include or define a refrigerant channel coupled with a fluid delivery system 117. In some embodiments, fluid delivery system 117 may be a cryogenic chiller, although the present technology is not limited to cryogenic applications as will be explained further below. The fluid delivery system 117 may be in fluid communication with the refrigerant channel via a refrigerant inlet conduit 123 connected to an inlet of the refrigerant channel and via a refrigerant outlet conduit 125 connected to an outlet of the refrigerant channel such that the base assembly 105 may be maintained at a predetermined temperature, such as a first temperature. In some embodiments, the fluid delivery system 117 may be coupled with an interface box to control a flow rate of the refrigerant. The refrigerant may include a material that can maintain any temperature, including a cryogenic temperature, that may be below or about 0° C., below or about −50° C., below or about −80° C., below or about −100° C., below or about −125° C., below or about −150° C., or lower.

Again, it is to be understood that other substrate supports encompassed by the present technology may be configured to operate at a variety of other processing temperatures as well, including above or about 0° C., greater than or about 100° C., greater than or about 250° C., greater than or about 400° C., or greater. The fluid delivery system 117 may provide the refrigerant, which may be circulated through the refrigerant channel of the base assembly 105. The refrigerant flowing through the refrigerant channel may enable the base assembly 105 to be maintained at the processing temperature, which may assist in controlling the lateral temperature profile of the electrostatic chuck 150 so that a substrate 124 disposed on the electrostatic chuck 150 may be uniformly maintained at a cryogenic processing temperature.

The facility plate 107 may include or define a coolant channel coupled with a chiller 119. The chiller 119 may be in fluid communication with the coolant channel via a coolant inlet conduit 127 connected to an inlet of the coolant channel and via a coolant outlet conduit 129 connected to an outlet of the coolant channel such that the facility plate 107 may be maintained at a second temperature, which in some embodiments may be greater than the first temperature. In some embodiments, a single, common chiller may be used for fluid delivery to both the base assembly and the facility plate. Consequently, in some embodiments fluid delivery system 117 and chiller 119 may be a single chiller or fluid delivery system. In some embodiments, the chiller 119 may be coupled with an interface box to control a flow rate of the coolant. The coolant may include a material that can maintain temperatures greater than or about 0° C., and may maintain temperatures greater than or about 20° C., greater than or about 30° C., greater than or about 40° C., greater than or about 50° C., or greater. In some embodiments, alternative heating mechanisms may be employed including resistive heaters, which may be distributed in the facility plate, the electrostatic chuck, or the base assembly. In some embodiments the facility plate may not include heating components. The chiller 119 may provide the coolant, which may be circulated through the coolant channel of the facility plate 107. The coolant flowing through the coolant channel may enable the facility plate 107 to be maintained at a predetermined temperature, which may assist in maintaining the insulator plate 109 at a temperature above the first temperature, for example.

The electrostatic chuck 150 may include a support surface on which a substrate 124 may be disposed, and may also include a bottom surface 132 opposite the support surface. In some embodiments, the electrostatic chuck 150 may be or include a ceramic material, such as aluminum oxide, aluminum nitride, or other suitable materials. Additionally, the electrostatic chuck 150 may be or include a polymer, such as polyimide, polyetheretherketone, polyaryletherketone, or any other polymer which may operate as an electrostatic chuck within the processing chamber.

The electrostatic chuck 150 may include a chucking electrode 126 incorporated within the chuck body. The chucking electrode 126 may be configured as a monopole or bipolar electrode, or any other suitable arrangement for electrostatically clamping a substrate. The chucking electrode 126 may be coupled through an RF filter to a chucking power source 134, which may provide a DC power to electrostatically secure the substrate 124 to the support surface of the electrostatic chuck 150. The RF filter may prevent RF power utilized to form a plasma within the plasma processing chamber 100 from damaging electrical equipment or presenting an electrical hazard outside the chamber.

The electrostatic chuck 150 may include one or more resistive heaters 128 incorporated within the chuck body. The resistive heaters 128 may be utilized to elevate the temperature of the electrostatic chuck 150 to a processing temperature suitable for processing a substrate 124 disposed on the support surface. The resistive heaters 128 may be coupled through the facility plate 107 to a heater power source 136. The heater power source 136 may provide power, which may be several hundred watts or more, to the resistive heaters 128. The heater power source 136 may include a controller utilized to control the operation of the heater power source 136, which may generally be set to heat the substrate 124 to a predetermined processing temperature. In some embodiments, the resistive heaters 128 may include a plurality of laterally separated heating zones, and the controller may enable at least one zone of the resistive heaters 128 to be preferentially heated relative to the resistive heaters 128 located in one or more of the other zones. For example, the resistive heaters 128 may be arranged concentrically in a plurality of separated heating zones. The resistive heaters 128 may maintain the substrate 124 at a processing temperature suitable for processing.

The substrate support assembly 101 may include one or more probes disposed therein. In some embodiments, one or more low temperature optical probe assemblies may be coupled with a probe controller 138. Temperature probes may be disposed in the electrostatic chuck 150 to determine the temperature of various regions of the electrostatic chuck 150. In some embodiments, each probe may correspond to a zone of the plurality of laterally separated heating zones of the resistive heaters 128. The probes may measure the temperature of each zone of the electrostatic chuck 150. The probe controller 138 may be coupled with the heater power source 136 so that each zone of the resistive heaters 128 may be independently heated. This may allow the lateral temperature profile of the electrostatic chuck 150 to be maintained substantially uniform based on temperature measurements, which may allow a substrate 124 disposed on the electrostatic chuck 150 to be uniformly maintained at the processing temperature.

In embodiments of the present technology, the atomic oxygen sensor 103 may be positioned a various locations in the processing chamber 100. FIG. 1B shows a cross-sectional embodiment of the semiconductor processing chamber 100 with the atomic oxygen sensor 103 positioned proximate to the injection apparatus 112 that may function as a gas inlet for one or more oxygen-containing gases. Positioning the atomic oxygen sensor 103 proximate to the injection apparatus 112 allows the sensor to characterize the level of atomic oxygen in the gas or plasma where the process gases are introduced into the processing chamber 100. In embodiments of some processing methods, the atomic oxygen sensor 103 positioned proximate to the injection apparatus 112 may be used to characterize atomic oxygen levels in oxygen-containing plasma effluents generated outside the processing chamber 100. In additional embodiments, data from the atomic oxygen sensor 103 may be used to adjust conditions in a remotely-generated plasma that supplies oxygen-containing plasma effluents to the processing chamber 100 through the injection apparatus 112. Real-time data from an atomic oxygen sensor 103 positioned close to the injection apparatus 112 can provide more timely feedback on the health of the remotely-generated plasma than a sensor positioned further away from the injection apparatus.

FIG. 1C shows a cross-sectional embodiment of a semiconductor processing chamber 100 with the atomic oxygen sensor 103 positioned proximate to exhaust port 116 formed in the chamber. The exhaust port 116 may function as a gas outlet that permits oxygen-containing gases and plasma effluents to flow out of the processing chamber 100. In embodiments of some processing methods, the atomic oxygen sensor 103 positioned proximate to the exhaust port 116 may be used to characterize atomic oxygen levels in oxygen-containing gases and plasma effluents following their exposure to the substrate. In additional embodiments, data from the atomic oxygen sensor 103 may be used to characterize conditions and events in the substrate processing region, including, for example, the detection of an operation's endpoint. Real-time data from an atomic oxygen sensor 103 positioned close to the exhaust port 116 may also provide timely feedback on the health of an in-situ generated plasma in the substrate processing region of the processing chamber 100.

Figure 2:
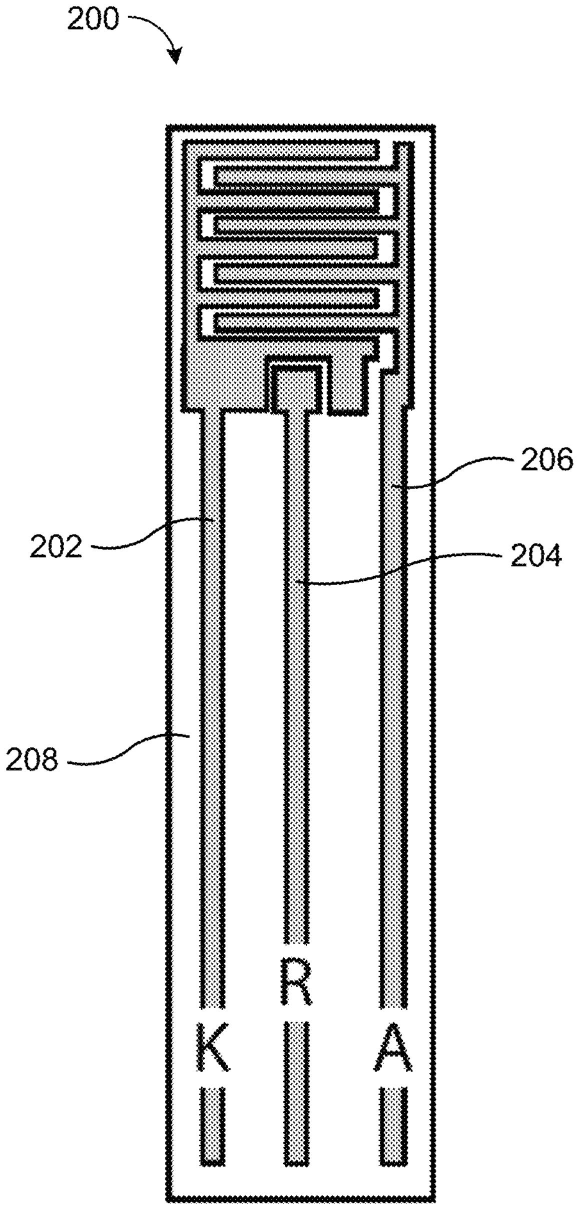
FIG. 2 shows a simplified schematic view of an exemplary atomic oxygen sensor according to some embodiments of the present technology.

FIG. 2 shows a simplified schematic of an atomic oxygen sensor 200 according to embodiments of the present technology. In the embodiment shown, the atomic oxygen sensor 200 includes a cathode electrode 202, a reference electrode 204, and an anode electrode 206. The electrodes may be formed on a solid electrolyte 208 that may function to transport oxygen species (e.g., $O^2$) between the cathode electrode 202 and anode electrode 206. In embodiments, the atomic oxygen sensor 200 may measure a level of atomic oxygen in the atmosphere contacting the sensor by measuring a flux of oxygen atoms (a neutral species) that are ionized at a boundary between the cathode electrode 202, solid electrolyte 208, and the adjacent atmosphere of the substrate processing region. In some embodiments, the reference electrode 204 may be used to maintain a constant voltage at the cathode electrode 204 to prevent changes in formation rate of oxygen ions due to changes in the voltage potential at the cathode electrode.

The oxygen ions (e.g., $O^{2}$ $^{-}$ions) formed at the cathode electrode 202 may be driven through the solid electrolyte 208 to the anode electrode 206 by a potential difference between the electrodes. When the oxygen ions arrive at the anode electrode 206, they may be neutralized into molecular oxygen at the boundary formed by the solid electrolyte 208, the anode electrode 206, and the adjacent atmosphere into which the molecular oxygen is released. The electrons removed from the oxygen ions at the anode electrode 206 may generate an electric current that passes through an external circuit (not shown) back to the cathode electrode 202. The amount of the electric current may be proportional to the flux of atomic oxygen absorbed by the sensor at the cathode electrode 202 to provide a signal that can be calibrated to determine a partial pressure of atomic oxygen in the atmosphere of the substrate processing region.

In some embodiments, the cathode electrode 202 may include metallic gold. Unlike platinum and other coinage metals, gold has a high selectivity for absorbing atomic oxygen over molecular oxygen ($O_2$). A cathode electrode 202 primarily made of metallic gold may selectively absorb and ionize atomic oxygen to generate oxygen ions that become a current carrier in the atomic oxygen sensor. Molecular oxygen present in the atmosphere of the substrate processing region with the atomic oxygen is absorbed at a much lower rate (or not at all) by the gold-containing cathode electrode 202, and does not significantly interfere with the sensor's measurement of the partial pressure of atomic oxygen.

In some embodiments, the solid electrolyte 208 may include a ceramic material capable of transporting (i.e., conducting) the oxygen ions formed by the ionization of the atomic oxygen at the cathode electrode 202. In additional embodiments, the solid electrolyte 208 may include yttria-stabilized zirconia (YSZ) maintained at temperature that has a high conductivity for the oxygen ions. In some embodiments, during sensor operation the temperature of the solid electrolyte 208 may be characterized at greater than or about 400° C., greater than or about 425° C., greater than or about 450° C., greater than or about 475° C., greater than or about 500° C., or more. In additional embodiments, the atomic oxygen sensor 200 may further include a heating unit (not shown) to raise and maintain the temperature of the solid electrolyte 208 during sensor operation.

Figure 3:
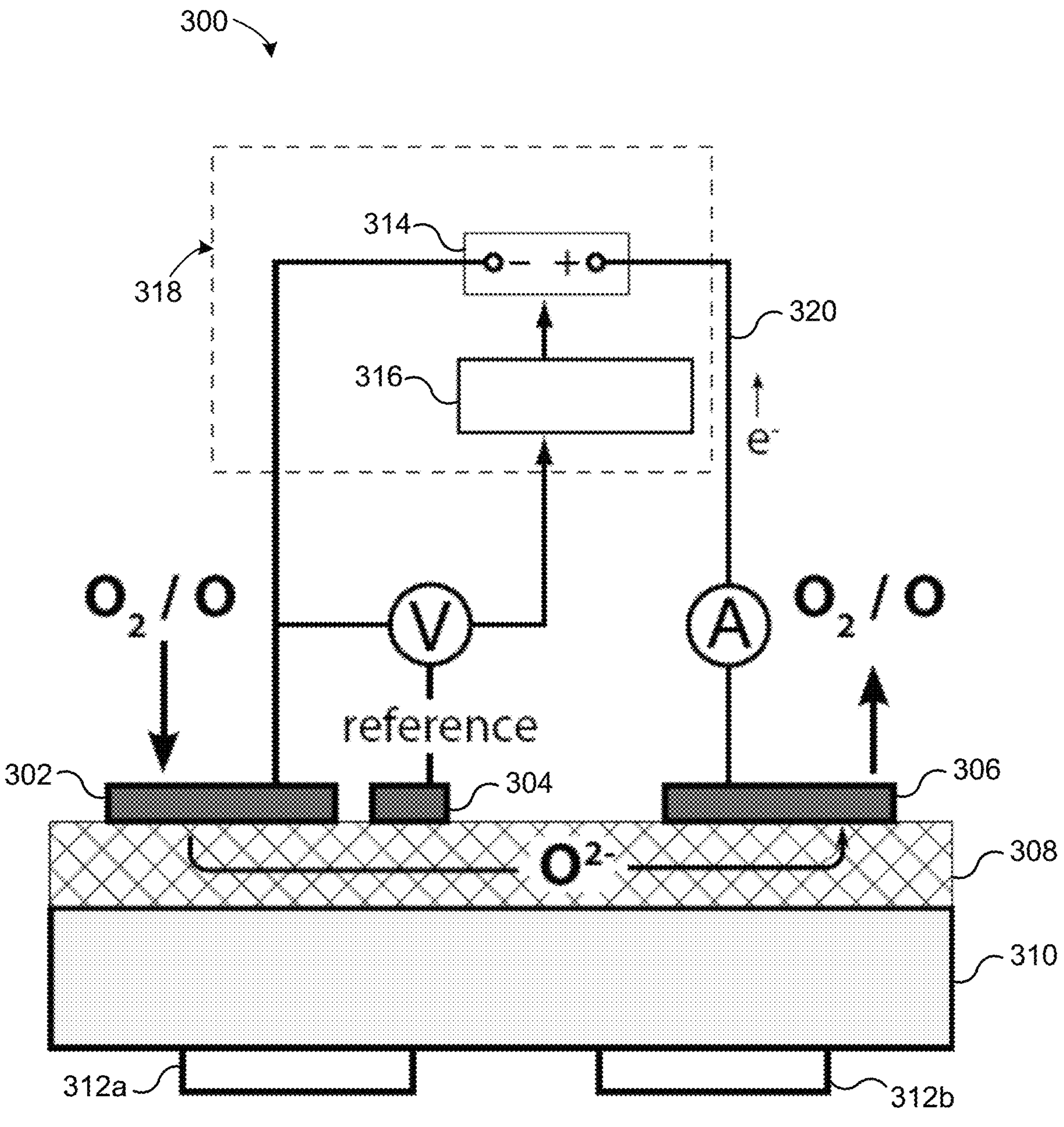
FIG. 3 shows a simplified electrical schematic of an exemplary atomic oxygen sensor according to some embodiments of the present technology.

FIG. 3 shows a simplified schematic circuit of an atomic oxygen sensor 300 according to embodiments of the present technology. In embodiments, sensor 300 may include a cathode electrode 302, a reference electrode 304, and an anode electrode 306 arranged on a solid electrolyte 308. In the embodiment shown, the atomic oxygen sensor 300 may further include a substrate 310 and heating elements 312*a-b* that contact a surface of the substrate 310 opposite a surface that is in contact with the electrodes.

In embodiments, the cathode electrode 302 and the anode electrode 306 may be in electrical communication with a voltage source 314 that applies a voltage between the electrodes. The voltage may create a gradient in the electrochemical potential between the electrodes that drives the oxygen ions generated from the ionization of atomic oxygen absorbed at the cathode electrode 302 to the anode electrode 306. The net flux of charge created by the migration of the oxygen ions through the electrolyte 308 is proportional to a current passing through an external circuit 316 that incorporates the voltage source 314. A change in the current passing through the external circuit provides information on the flux of oxygen ions migrating through the electrolyte 308. The oxygen ion flux is proportional to the rate atomic oxygen is absorbed at the cathode electrode 302. The absorption rate of the atomic oxygen at the cathode is proportional to the partial pressure of atomic oxygen in the nearby atmosphere of the substrate processing region in the processing chamber. Thus, calibrated measurements of the electrical current in an electronic circuit 320 incorporating the atomic oxygen sensor may provide measurements of the partial pressure of atomic oxygen in the atmosphere of the substrate processing region proximate to the sensor.

In some embodiments, the heater elements 312*a-b* may provide resistive heating to heat the substrate 310 and solid electrolyte 308 to a temperature that facilitates the conduction of the oxygen ions through the electrolyte during sensor operation. In embodiments, the heater elements 312*a-b* may be used to raise and maintain the substrate 310 and solid electrolyte 308 at a temperature greater than or about 400° C., greater than or about 425° C., greater than or about 450° C., greater than or about 475° C., greater than or about 500° C., or more. The atomic oxygen sensor 300 may also include a temperature sensor and controller (not shown) that monitors the temperature of the solid electrolyte 308 and adjusts the amount of power delivered to the heater elements 312*a-b* to maintain an electrolyte temperature during sensor operation.

In some embodiments, the atomic oxygen sensor 300 may also include a controller 316 that is electronically coupled to the reference electrode 304 and the voltage source 314. In embodiments, the controller 316 and the voltage source 314 may work in concert as a potentiostat 318 that maintains a constant voltage between the reference electrode 304 and the cathode electrode 302 during varying partial pressures of atomic oxygen in the atmosphere that contacts the cathode electrode 302. To maintain this constant voltage, the voltage provided by the voltage source 314 may change in level that is proportional to the change in atomic oxygen partial pressure. Thus, in some embodiments, changes in the partial pressure of the atomic oxygen may be measured by changes in the voltage level output by the voltage source 314 of potentiostat 318.

In embodiments, the atomic oxygen sensor 300 may characterize the partial pressure of atomic oxygen in the substrate processing region of the processing chamber by measuring at least one of the amount of electric current in the electronic circuit 320 or the voltage level output by the potentiostat 318. As noted above, the atomic oxygen sensor 300 may characterize the partial pressure of the atomic oxygen at different points in the substrate processing region depending on the placement of the sensor in the processing chamber. In some embodiments, two or more sensors may be placed in the processing chamber to characterize the partial pressure of the atomic oxygen at two or more points in the substrate processing region that has a heterogeneous distribution of the atomic oxygen.

In some embodiments, the atomic oxygen sensor 300 may provide real-time information about the partial pressure of atomic oxygen in the substrate processing region of the processing chamber. In embodiments, the timeliness of this real-time information may be characterized by the response time of the atomic oxygen sensor 300 to changes in the atomic oxygen's partial pressure. This response time may be measured by the amount of time that elapses for the sensor to be within 5% of a stationary sensor signal measuring a static partial pressure of the atomic oxygen. In some embodiments, the atomic oxygen sensor 300 may be characterized by a response time of 2 seconds or less, 1 second or less, 0.5 seconds or less, 0.1 second or less, or less. The fast response time of the sensor provides real-time information about the gas or plasma conditions in the substrate processing region, and permits timely adjustments of process parameters during a processing operation. In some embodiments, these process parameters may include a flow rate for an oxygen-containing gas or plasma effluent into the processing chamber, a gas pressure in the processing chamber, and a power level delivered to an oxygen-containing plasma process gas in a remote plasma or the substrate processing region, among other process parameters.

Figure 4:
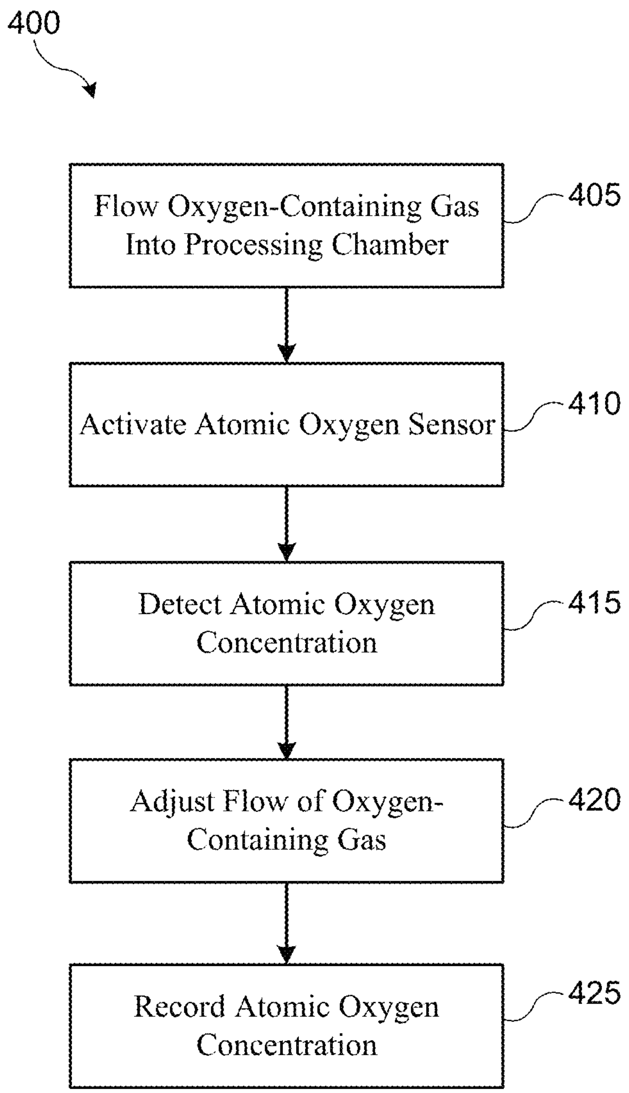
FIG. 4 shows selected operations in a method of detecting atomic oxygen in a substrate processing region according to some embodiments of the present technology.

In embodiments of the present technology, the atomic oxygen sensors may be used to characterize the atomic oxygen levels in semiconductor processing methods. FIG. 4 shows a flowchart with selected operations in a method 400 of detecting atomic oxygen in a processing region of a processing chamber according to embodiments of the present technology. It will be appreciated that any processing chamber may be utilized that can perform one or more operations of the present processing methods. Additionally, the methods may be performed with chambers or systems that include embodiments of one or more of the atomic oxygen sensors described previously. Method 400 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 400 may involve optional operations to develop a semiconductor substrate to a particular fabrication operation. Although in some embodiments method 400 may be performed on a base structure, in some embodiments the method may be performed subsequent other material formation. For example, any number of deposition, masking, or removal operations may be performed to produce any transistor, memory, or other structural aspects on a substrate, while the atomic oxygen sensor is activated and detecting a level of atomic oxygen in the substrate processing region. In some embodiments, the substrate may be disposed on a substrate support in the substrate processing region of the processing chamber. The substrate operations may be performed in the same chamber in which aspects of method 400 may be performed, and one or more operations may also be performed in one or more chambers on a similar platform as a chamber in which operations of method 400 may be performed, or on other platforms.

In some embodiments, method 400 may include flowing at least one oxygen-containing gas or plasma effluent into a substrate processing region of a processing chamber 405. In embodiments, the oxygen-containing gas or plasma effluent may include one or more atomic oxygen species such as ground state atomic oxygen and electronically-excited states of atomic oxygen. In additional embodiments, the oxygen-containing gas or plasma may include molecular oxygen ($O_2$). In still further embodiments, the oxygen-containing gas or plasma may include one or more carrier gases and inert gases such as helium, molecular nitrogen ($N_2$), and argon, among other carrier and inert gases. In yet further embodiments, the oxygen-containing gas or plasma may include one or more reactive gases such as molecular hydrogen ($H_2$), ammonia, silicon-containing gases, and halogen-containing gases, among other reactive gases.

In some embodiments, the oxygen-containing gas or plasma effluent flowing into the substrate processing region may maintain the processing chamber in a pressure range. For example, the processing chamber may be characterized by a pressure of greater than or about 0.01 Torr, greater than or about 0.1 Torr, greater than or about 1 Torr, greater than about 2 Torr, greater than or about 5 Torr, or more. In additional embodiments, the oxygen-containing gas or plasma effluent may provide a partial pressure of atomic oxygen to the processing chamber. For example, the processing chamber may be characterized by an atomic oxygen partial pressure of greater than or about 1 mTorr, greater than or about 10 mTorr, greater than or about 100 mTorr, or more. Atomic oxygen is a highly reactive species that readily combines with other species, including other atomic oxygen to form more stable molecular oxygen. Thus, it will be appreciated that a partial pressure of atomic oxygen may quickly vary over time at various locations in the substrate processing region of the processing chamber. In still more embodiments, the oxygen-containing gas or plasma effluent may provide a partial pressure of molecular oxygen to the processing chamber. For example, the processing chamber may be characterized by a molecular oxygen partial pressure of greater than or about 0.01 Torr, greater than or about 0.1 Torr, greater than or about 1 Torr, greater than about 2 Torr, greater than or about 5 Torr, or more. In embodiments of the present technology, the atomic oxygen sensor may selectively measure the partial pressure of the atomic oxygen in the substrate processing region without the molecular oxygen interfering with the measurement.

In some embodiments, the method 400 may further include activating an atomic oxygen sensor 410. In embodiments, the activating operation may include heating a solid electrolyte component of the sensor to a temperature that facilitates the conduction of oxygen ions through the electrolyte. Exemplary temperature ranges for oxygen ion conduction may include greater than or about 400° C., greater than or about 425° C., greater than or about 450° C., greater than or about 475° C., greater than or about 500° C., or more. In additional embodiments, the activating operation may include unblocking the atomic oxygen sensor from gases and plasma effluents in the substrate processing region to permit the sensor to characterize the amount of atomic oxygen in a location of the region. In some embodiments, the unblocking operation may include an opening, valve, baffle, door, shutter, aperture, or some other reversibly openable partition to permit the gases and plasma effluents in the substrate processing region to contact at least the cathode electrode on the atomic oxygen sensor. Controlling the exposure of the atomic oxygen sensor to the atmosphere in the substrate processing region prevents the sensor from contacting gases and plasma effluents that may foul or corrode the sensor's components. For example, the atomic oxygen sensor may be blocked from the atmosphere in the substrate procession region during periods of a deposition or etching operation where gases and plasma effluents are present in the region that can damage the sensor. In embodiments, the activation of the atomic oxygen sensor includes unblocking during periods where these gases and plasma effluents are at reduced pressures or being supplied with reduced power in the substrate processing region.

In additional embodiments, activating the atomic oxygen sensor 410 may include generating a coulombic field that reduces the flux of ions in the atmosphere of the substrate processing region from being detected by the sensor. In some embodiments, the coulombic field may be generated by applying an electrical potential to an ion suppression barrier such as a wire mesh or perforated plate of conductive material through which ions from the substrate processing region may pass to reach the atomic oxygen sensor. In these embodiments, ions of like charge as the applied electrical potential will be pushed away from the ion suppression barrier while ions of opposite charge will be pulled away from the sensor towards the barrier. The flux of both positive and negative ions reaching the sensor will be reduced while neutral species including atomic oxygen can pass freely through the ion suppression barrier. In embodiments, this reduces interference from ionized species in the characterization of atomic oxygen in the substrate processing region.

In embodiments, the method 400 may further include the detection of atomic oxygen levels in the substrate processing region by the atomic oxygen sensor 415. In embodiments, the partial pressure of atomic oxygen in the substrate processing region of the processing chamber may be characterized by the electric current of a circuit that includes a flux of oxygen ions moving through the atomic oxygen sensor's solid electrolyte from a cathode electrode to an anode electrode. In additional embodiments, the partial pressure of atomic oxygen in the substrate processing region may be characterized by a change in a voltage from a voltage supply to the cathode electrode and a reference electrode caused by a change in the flux of oxygen ions generated from atomic oxygen at an interface of the cathode electrode and solid substrate. In embodiments, the current or voltage signals generated by the atomic oxygen sensor may be calibrated against known partial pressures of atomic oxygen in a substrate processing region to characterize the partial pressure of atomic oxygen in atmospheres where the partial pressure is being characterized.

In some embodiments, the method 400 may further include adjusting the flow of the oxygen-containing gas into the semiconductor processing chamber based on the concentration of atomic oxygen detected by the atomic oxygen sensor 420. In embodiments, the flow adjustment may be made by an electronic flow controller that compares a data signal from the atomic oxygen sensor with information about an atomic oxygen concentration in the semiconductor processing chamber with a reference signal. The electronic flow controller may adjust the flow rate of the oxygen-containing gas into the semiconductor processing chamber based on the comparison of the data signal and the reference signal. In further embodiments, these comparisons and flow level adjustments may be made continuously during a semiconductor fabrication operation in the semiconductor processing chamber. In still further embodiments, these comparisons and adjustments may be made by the controller automatically without operator intervention during a semiconductor fabrication operation. In yet further embodiments, these comparisons and adjustments may be made by the controller in real time during a semiconductor fabrication operation.

In some embodiments, the method 400 may further include recording the partial pressure of atomic oxygen over time in a substrate processing region 425. In embodiments, the atomic oxygen partial pressure may be recorded at one or more times before, during, and after a substrate processing operation. In additional embodiments, the atomic oxygen partial pressure may be recorded over an entire duration of a processing operation, or during a smaller fraction of an entire operation. In still additional embodiments, the atomic oxygen partial pressure may be recorded at one or both of the starting point of an operation or the end point of a processing operation in order to indicate the start or end of the processing operation.

In embodiments, the data generated from recording the partial pressure of the atomic oxygen over time may be processed, and the processed data may be used to generate or initiate a library of results or outcomes that may facilitate additional process operations. This generated library may be accessed by a processor for machine learning, where an algorithm may be implemented to identify patterns from processing scenarios, which may provide a machine learning model to facilitate predictive adjustments to processing or chamber conditions. Algorithms may include consideration of chamber conditions, process conditions, materials or properties for components of the system, among any number of other considerations that may be collected during processing and analyzed to train the machine learning model. Deep machine learning algorithms may be developed for substrate fabrication operations such as depositions, patterning, and etching, among other operations. The machine learning may further populate the data library and iteratively improve predictions for any number of chamber or processing scenarios. Consequently, over time the model may control processing by predicting effects based on atomic oxygen levels, and may adjust any number of processing parameters in situ to protect substrate or chamber components, and improve process outcomes.

One or more computing devices or components may be adapted to provide some of the desired functionality described herein by accessing software instructions rendered in a computer-readable form. The computing devices may process or access signals for operation of one or more of the components of the present technology, such as the acoustic emission processor or controller, for example. When software is used, any suitable programming, scripting, or other type of language or combinations of languages may be used to perform the processes described. However, software need not be used exclusively, or at all. For example, some embodiments of the present technology described above may also be implemented by hard-wired logic or other circuitry, including but not limited to application-specific circuits. Combinations of computer-executed software and hard-wired logic or other circuitry may be suitable as well.

Some embodiments of the present technology may be executed by one or more suitable computing device adapted to perform one or more operations discussed previously. As noted above, such devices may access one or more computer-readable media that embody computer-readable instructions which, when executed by at least one processor that may be incorporated in the devices, cause the at least one processor to implement one or more aspects of the present technology. Additionally or alternatively, the computing devices may comprise circuitry that renders the devices operative to implement one or more of the methods or operations described.

Any suitable computer-readable medium or media may be used to implement or practice one or more aspects of the present technology, including but not limited to, diskettes, drives, and other magnetic-based storage media, optical storage media, including disks such as CD-ROMS, DVD-ROMS, or variants thereof, flash, RAM, ROM, and other memory devices, and the like.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the probe" includes reference to one or more probes and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing chamber comprising:
a chamber body defining a substrate processing region;
a substrate support positioned within the substrate processing region and configured to support a substrate in the chamber body; and
an atomic oxygen sensor positioned within the substrate processing region on the substrate support, wherein the atomic oxygen sensor is configured to measure a concentration of atomic oxygen contacting the atomic oxygen sensor and wherein the atomic oxygen sensor includes at least one electrode inside the chamber body.

2. The semiconductor processing chamber of claim 1, wherein the at least one electrode comprises metallic gold.

3. The semiconductor processing chamber of claim 1, wherein the atomic oxygen sensor includes a ceramic electrolyte inside the chamber body, the ceramic electrolyte comprising yttria stabilized zirconia.

4. The semiconductor processing chamber of claim 1, wherein the atomic oxygen sensor is surrounded by an ion suppression screen inside the chamber body that reduces a flux of ions contacting the atomic oxygen sensor.

5. The semiconductor processing chamber of claim 1, wherein the atomic oxygen sensor comprises a reversible barrier inside the chamber body to reversibly prevent gases in the chamber from contacting the atomic oxygen sensor.

6. The semiconductor processing chamber of claim 1, wherein the semiconductor processing chamber is a plasma processing chamber comprising at least one of:
a plurality of coils to generate an inductively-coupled plasma in the substrate processing region;
at least two electrodes to generate a capacitively-coupled plasma in the substrate processing region; or
an inlet for remote plasma effluents generated by a remote plasma system positioned outside the semiconductor processing chamber.

7. A semiconductor processing chamber comprising:
a chamber body defining a substrate processing region;
a gas inlet in the chamber body to supply gas to the substrate processing region, and a gas outlet in the chamber body to remove gas effluents from the substrate processing region; and
an atomic oxygen sensor mounted on an interior of a lid or sidewall defining the substrate processing region and positioned within the substrate processing region between the gas inlet and the gas outlet such that the atomic oxygen sensor characterizes a level of atomic oxygen where the gas enters the substrate processing region or where the gas effluents leave the substrate processing region, wherein the atomic oxygen sensor includes at least one electrode inside the chamber body.

8. The semiconductor processing chamber of claim 7, wherein the semiconductor processing chamber further comprises a substrate support positioned within the substrate processing region.

9. The semiconductor processing chamber of claim 7, wherein the atomic oxygen sensor is positioned closer to the gas inlet than the gas outlet, and the atomic oxygen sensor is configured to characterize a level of atomic oxygen in the gas from plasma effluents generated outside the processing chamber.

10. The semiconductor processing chamber of claim 7, wherein the atomic oxygen sensor is positioned closer to the gas outlet than the gas inlet, and the atomic oxygen sensor is configured to characterize a level of atomic oxygen in the gas effluents from a plasma generated inside the processing chamber.

11. The semiconductor processing chamber of claim 7, wherein the atomic oxygen sensor includes at least one electrode comprising metallic gold inside the chamber body, and includes a ceramic electrolyte comprising yttria stabilized zirconia inside the chamber body.

12. A semiconductor processing chamber comprising:

a chamber body defining a substrate processing region;

a substrate support positioned within the substrate processing region;

an atomic oxygen sensor positioned within the substrate processing region, wherein the atomic oxygen sensor is configured to detect atomic oxygen without also detecting molecular oxygen or ionic oxygen species and without requiring a detection of photon emissions and wherein the atomic oxygen sensor includes at least one electrode inside the chamber body.

13. The semiconductor processing chamber of claim 12, further comprising a controller configured to perform operations comprising:

determining a concentration of atomic oxygen in the substrate processing region using measurements from the atomic oxygen sensor; and causing a flow of oxygen-containing gas into the semiconductor processing chamber to be adjusted based on the concentration of atomic oxygen detected by the atomic oxygen sensor.

14. The semiconductor processing chamber of claim 13, wherein the operations further comprise:

causing a coulombic field to be generated that reduces a flux of ions in the substrate processing region contacting the atomic oxygen sensor to be reduced.

15. The semiconductor processing chamber of claim 13, wherein the operations further comprise:

causing gases to be blocked from contacting the atomic oxygen sensor during a plasma process in the substrate processing region; and causing the atomic oxygen sensor to be unblocked from the gases in the substrate processing region to permit the sensor to detect the concentration of atomic oxygen in the substrate processing region before or after the plasma process.

16. The semiconductor processing chamber of claim 12, wherein the atomic oxygen sensor includes at least one electrode inside the chamber body comprising a material selectively permeable to atomic oxygen over molecular oxygen, and the atomic oxygen sensor includes a solid electrolyte inside the chamber body that selectively conducts atomic oxygen ions.

17. The semiconductor processing chamber of claim 12, wherein the atomic oxygen sensor is positioned proximate to a gas inlet in the semiconductor processing chamber to detect a concentration of atomic oxygen in an oxygen-containing gas supplied to the substrate processing region from the gas inlet.

18. The semiconductor processing chamber of claim 12, wherein the atomic oxygen sensor is positioned proximate to a gas outlet in the semiconductor processing chamber to detect a concentration of atomic oxygen in an effluent gas before the effluent gas exits the substrate processing region through the gas outlet.

* * * * *